United States Patent [19]

Sasaki et al.

[11] Patent Number: 4,789,620

[45] Date of Patent: Dec. 6, 1988

[54] LIQUID PHOTOSENSITIVE RESIN COMPOSITION CONTAINING CARBOXYLATED EPOXY ACRYLATES OR METHACRYLATES

[75] Inventors: Isao Sasaki, Saiki; Kenji Kushi; Ken-ichi Inukai, both of Ohtake, all of Japan

[73] Assignee: Mitsubishi Rayon Co. Ltd., Tokyo, Japan

[21] Appl. No.: 880,738

[22] Filed: Jul. 1, 1986

[30] Foreign Application Priority Data

Mar. 3, 1986 [JP] Japan ................................. 61-45779
Mar. 4, 1986 [JP] Japan ................................. 61-46768
Mar. 5, 1986 [JP] Japan ................................. 61-47889

[51] Int. Cl.$^4$ ................................. G03C 1/68
[52] U.S. Cl. ................................. 430/280; 430/281; 430/288; 522/103; 522/101
[58] Field of Search ................................. 430/280, 281, 288; 522/103, 101

[56] References Cited

U.S. PATENT DOCUMENTS 4,070,262  1/1978  Guarino et al. ................................. 522/103
4,146,452  3/1979  Weber et al. .
4,324,679  4/1982  Carlson ................................. 430/280
4,378,277  3/1983  Smith ................................. 430/280
4,426,431  1/1984  Harasta et al. ................................. 430/280
4,427,760  1/1984  Nasazawa et al. ................................. 430/280

Primary Examiner—Jack Brammer
Attorney, Agent, or Firm—Cushman, Darby & Cushman

[57] ABSTRACT

Disclosed is a liquid photosensitive resin composition comprising (a) an at least partially carboxyl-modified multifunctional epoxy acrylate and/or multifunctional epoxy methacrylate having an average acid value of 4 to 150 and a number average molecular weight of not greater than 5,000, (b) an acrylic and/or methacrylic cross-linking monomer and/or oligomer other than the epoxy acrylate and/or epoxy methacrylate, (c) an acrylic and/or methacrylic monoethylenically vinyl monomer, (d) an inorganic filler, and (e) a photo-initiator and/or photosensitizer.

This liquid photosensitive resin composition has excellent alkali developability, yields a cured coating film having good adhesion and good electrical insulating properties under high-humidity conditions, and is suitable for use as a solder resist in the fabrication of printed circuit boards.

9 Claims, No Drawings

LIQUID PHOTOSENSITIVE RESIN COMPOSITION CONTAINING CARBOXYLATED EPOXY ACRYLATES OR METHACRYLATES

BACKGROUND OF THE INVENTION

1. Field of the Invention

This invention relates to a liquid photosensitive resin composition and, more particularly, to a pattern-forming liquid photosensitive resin composition which can be used as a solder resist (or solder mask) in the fabrication of printed circuit boards.

2. Description of the Prior Art

Conventionally, a solder resist (or solder mask) is widely used in the fabrication of printed circuit boards in order to form a permanent protective coating for printed circuit boards. Such a solder resist is used for the purpose of preventing the formation of a solder bridge during soldering and of ensuring the protection of the conductive parts against corrosion and the retention of their electrical insulation during use. As is evident from their purpose of use, solder resists for use under severe conditions, unlike etching resists, must have the following characteristics:

(a) Retention of adhesion during soaking in solder. (at 240° to 280° C.)
(b) Permanent retention of adhesion.
(c) Excellent resistance to solvents and chemicals.
(d) Retention of good electrical insulating properties under high-humidity conditions.

In order to meet these requirements, it has been conventional and common practice to form solder resists by screen printing of a thermosetting ink or a photocurable ink. In recent years, however, the increasing miniaturization of printed circuits has created a demand for solder resists having large coating thickness and high precision, and it is the existing state of the art that the screen printing method for the formation of solder resists is no longer satisfactory from the viewpoint of precision and coating thickness.

The formation of solder resists by the development technique has been proposed as a means for responding to this miniaturization of printed circuits. According to the development technique, a pattern is formed by applying a liquid photosensitive resin composition, or laminating a photosensitive film, to a printed circuit board, exposing the coating layer to active radiation through, for example, a photomask to cure only desired portions thereof, and then washing the coating film with a developer to remove any uncured portions thereof. This technique makes it possible to form a solder resist pattern having large coating thickness and high precision.

According to the manner in which the coating film to be cured is formed, solder resists for use in the development technique can be classified into three types: dry film type, solvent evaporation type and solventless liquid type. Among them, solder resists of the dry film type, as disclosed in Japanese patent laid-open No. 1018/'79, have the disadvantage that, in order to cause the solder resist to adhere closely to an uneven surface having a circuit formed thereon, a special process such as heat lamination under reduced pressure is required as suggested in Japanese patent laid-open No. 52703/'77 and that, notwithstanding the use of such a process, perfect adhesion is not always ensured. In contrast, solder resists of the solvent evaporation type, as disclosed in Japanese patent laid-open No. 15733/'76, can exhibit good adhesion to an uneven surface having a circuit formed thereon. However, they have the disadvantage that, after the application of a liquid photosensitive resin composition, the resulting coating film must be dried in an explosion-proof dryer or similar equipment so as to evaporate the solvent. Accordingly, there is a great need to develop an improved photosensitive resin composition of the solventless liquid type for use as a solder resist.

On the other hand, liquid photosensitive resin compositions can also be classified according to the type of developer used. They include ones using an organic solvent such as 1,1,1-trichloroethane and ones using a dilute aqueous alkaline solution. Since the use of an organic solvent involves problems concerning the pollution of the working environment and the disposal of waste liquid, development with a dilute aqueous alkaline solution is highly desirable.

SUMMARY OF THE INVENTION

It is an object of the present invention to provide a liquid photosensitive resin composition having excellent alkali developability and, when cured, exhibiting good adhesion and good electrical insulating properties under high-humidity conditions.

It is another object of the present invention to provide a liquid photosensitive resin composition having excellent performance when used as a solder resist in the fabrication of printed circuit boards.

According to the present invention, there is provided a liquid photosensitive resin composition comprising (a) 10 to 55% by weight of an at least partially carboxyl-modified multifunctional epoxy acrylate and/or multifunctional epoxy methacrylate having an average acid value of 4 to 150 and a number average molecular weight of not greater than 5,000, (b) 10 to 55% by weight of an acrylic and/or methacrylic cross-linking monomer and/or oligomer other than the epoxy acrylate and/or epoxy methacrylate, (c) 5 to 55% by weight of an acrylic and/or methacrylic monoethylenically vinyl monomer, (d) 4 to 35% by weight of an inorganic filler, and (e) 0.05 to 20% by weight of a photo-initiator and/or photosensitizer.

Moreover, it has been found that a liquid photosensitive resin composition having more excellent performance can be obtained when the aforesaid acrylic and/or methacrylic cross-linking monomer and/or oligomer other than the epoxy acrylate and/or epoxy methacrylate [component (b)] comprises a monomer and/or oligomer ($b_1$) including 50% by weight or more of a monomer and/or oligomer containing ester linkages not associated with acrylate and/or methacrylate in the molecule and having a number average molecular weight of 200 to 800 and a number average molecular weight per polymerizable double bond of 100 to 250, or when the aforesaid acrylic and/or methacrylic monoethylenically vinyl monomer [component (c)] comprises a monomer ($c_1$) including 50% by weight or more of a compound of the general formula

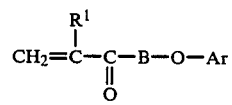

where $R^1$ is H— or $CH_3$—, B is

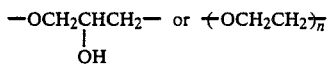

in which n is a whole number of 1 to 4, and Ar is

in which $R^2$ is H— or an alkyl group having not more than 12 carbon atoms. Especially when the aforesaid components ($b_1$) and ($c_1$) are used in combination, there can be obtained a liquid photosensitive resin composition exhibiting very high performance even under severe conditions.

DESCRIPTION OF THE PREFERRED EMBODIMENTS

The various components constituting the liquid photosensitive resin composition of the present invention will be described hereinbelow.

The liquid photosensitive resin composition of the present invention constains, as an essential component, 10 to 50% by weight of an at least partially carboxyl-modified multifunctional epoxy acrylate and/or multifunctional epoxy methacrylate having an average acid value of 4 to 150 and a number average molecular weight of not greater than 5,000.

Conventionally, the addition of a linear polymer containing carboxyl groups has been widely used as a means for imparting full alkali developability to a photosensitive resin composition of the full alkali developing type. However, the addition of a carboxyl-containing linear polymer to a liquid photosensitive resin composition for use as a solder resist would pose the following two serious problems: One is that, since such a linear polymer cannot form a cross-linked structure, the cured coating film will show a decrease in solvent resistance. The other is that a special reactive diluent capable of dissolving this carboxyl-containing linear polymer must be used to prepare the photosensitive resin composition in the form of a homogeneous solution, and this reactive diluent tends to reduce the electrical insulating properties required for use as a solder resist. In order to solve these problems, the present inventors carried on exhaustive research and have now found that the problems can be solved by using a specific, at least partially carboxyl-modified multifunctional epoxy acrylate and/or multifunctional epoxy methacrylate in place of the linear polymer. Thus, when the resulting composition is cured by active radiation, the at least partially carboxyl-modified multifunctional epoxy acrylate and/or multifunctional epoxy methacrylate is incorporated in the cross-linked structure and, therefore, can impart excellent solvent resistance to the cured coating film. Moreover, this component has a lower molecular weight than the aforesaid linear polymer and, therefore, can be readily and uniformly mixed with cross-linking monomers and other monomers usually used in combination. This allows greater latitude in monomer composition and makes it possible to achieve excellent properties such as electrical insulating properties.

The term "multifunctional epoxy acrylate and/or multifunctional epoxy methacrylate" as used herein denotes compounds obtained by the addition of acrylic acid and/or methacrylic acid to the epoxy groups present in multifunctional epoxy compounds or epoxy resins including, for example, bisphenol A-epichlorohydrin resins, epoxy-novolak resins, alicyclic epoxy resins, aliphatic epoxy resins, heterocyclic epoxy resins, glycidyl ester type resins and other resins as described in "Engineering Plastics" (published by Kagaku Kogyo Nipposha on Mar. 15, 1983).

The term "carboxyl-modified multifunctional epoxy acrylate and/or multifunctional epoxy methacrylate" as used herein denotes compounds obtained by the addition of a dibasic acid anhydride (such as maleic anhydride or succinic anhydride) to the OH groups present in a multifunctional epoxy acrylate and/or multifunctional epoxy methacrylate as described above or by the reaction of a multifunctional epoxy compound or epoxy resin with a dibasic acid, together with acrylic acid and/or methacrylic acid, and thus characterized by containing carboxyl groups in the molecule.

Such carboxyl-modified multifunctional epoxy acrylates and/or multifunctional epoxy methacrylates comprise a wide variety of compounds. Typical examples thereof include a compound obtained by the reaction of a bisphenol A-epichlorohydrin epoxy resin with acrylic acid and the subsequent addition of maleic anhydride (molar ratio of epoxy group/acrylic acid/maleic anhydride=1/1/0.1), a compound obtained by the reaction of a phenolic novolak epoxy resin with acrylic acid, methacrylic acid and succinic acid (molar ratio of epoxy group/acrylic acid/methacrylic acid/succinic acid=1/0.7/0.1/0.2), a compound obtained by the reaction of a hydrogenated bisphenol A type epoxy resin [such as ST-3000, manufactured by Tohto Kasei Co., Ltd.] with acrylic acid and the subsequent addition of succinic anhydride (molar ratio of epoxy group/acrylic acid/succinic anhydride=1/1/0.2), a compound obtained by the reaction of a long-chain aliphatic epoxy resin [such as EX-920, manufactured by Nagase & Company, Ltd.] with acrylic acid and the subsequent addition of maleic anhydride (molar ratio of epoxy group/acrylic acid/maleic anhydride=1/1/0.15), and a compound obtained by the reaction of an alicyclic expoxy resin [such as Araldite ® CY-175, manufactured by Ciba-Geigy Co., Ltd.] with acrylic acid and the subsequent addition of maleic anhydride (molar ratio of epoxy group/acrylic acid/maleic anhydride=1/1/0.15).

As component (a), the carboxyl-modified multifunctional epoxy acrylate and/or multifunctional epoxy methacrylate may be used alone or in combination with an unmodified multifunctional acrylate and/or multifunctional methacrylate. Alternatively, in the preparation of a carboxyl-modified multifunctional epoxy acrylate and/or multifunctional epoxy methacrylate (as described in connection with the above typical examples), the multifunctional epoxy acrylate and/or multifunctional epoxy methacrylate may be carboxyl-modified under such conditions as to leave a part thereof unmodified, and the resulting mixture may be used as such.

However, component (a) as a whole should have an average acid value of 4 to 150. If the average acid value is less than 4, the resulting composition will have such poor washability with alkali that, after curing, the uncured portions of the compositions cannot be thoroughly washed off. On the other hand, if the average acid value is greater than 150, the cured coating film will be so hygroscopic that it cannot retain good electrical insulating properties under high-humidity conditions. From the viewpoint of electrical insulating properties, the preferred range of the average acid value is from 5 to 100.

Moreover, component (a) should have a number average molecular weight of not greater than 5,000. If the number average molecular weight is greater than 5,000, the resulting composition will have unduly high viscosity and, therefore, exhibit poor alkali developability and poor miscibility with other monomers and oligomers. In view of the handling properties of the composition, it is preferable that component (a) has a number average molecular weight of not greater than 3,000.

Further, component (a) should be used in an amount of 10 to 55% by weight, preferably 15 to 50% by weight, based on the total weight of the composition. If the amount of component (a) used is less than 10% by weight, the resulting composition will have low resolution and give a cured coating film having poor adhesion to metallic surfaces. On the other hand, if it is greater than 55% by weight, the resulting composition will show a reduction in electrical insulating properties under high-humidity conditions.

The liquid photosensitive resin composition of the present invention also contains, as an essential component, 10 to 55% by weight of an acrylic and/or methacrylic cross-linking monomer and/or oligomer [component (b)] other than the aforesaid multifunctional epoxy acrylate and/or multifunctional epoxy methacrylate.

This cross-linking monomer and/or oligomer [component (b)] contains two or more polymerizable double bonds in the molecule and serves not only to dilute the aforesaid epoxy acrylate and/or epoxy methacrylate [component (a)] and thereby control the viscosity of the composition, but also to improve the properties required for use a solder resist, such as the curing rate of the composition and the scratch resistance, solvent resistance and electrical insulating properties of the cured coating film. From the viewpoint of curability by active radiation and copolymerizability with the aforesaid epoxy acrylate and/or epoxy methacrylate, this cross-linking monomer and/or oligomer must comprise an acrylic and/or methacrylic compound.

As component (b), there may be used any of various acrylic and/or methacrylic cross-linking monomers and oligomers. Typical examples thereof include 1,4-butanediol diacrylate, 1,4-dutanediol dimethacrylate, 1,6-hexamethylene glycol diacrylate, 1,6-hexamethylene glycol dimethacrylate, neopentyl glycol diacrylate, neopentyl glycol dimethacrylate, trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol hexaacrylate, dipentaerythritol hexamethacrylate, triethylene glycol diacrylate, triethylene glycol dimethacrylate, urethane acrylates [such as Viscoat® #812, #813, #823 and #851, manufactured by Osaka Organic Chemical Industry Co., Ltd.], and urethane methacrylates. These compounds may be used alone or in admixture of two or more.

From the viewpoint of alkali developability, adhesion, solvent resistance, electrical insulating properties and other properties, component (b) should be used in an amount of 10 to 55% by weight based on the photosensitive resin composition. If the amount of component (b) used is less than 10% by weight, the resulting composition will have poor solvent resistance and show a reduction in electrical insulating properties under high-humidity conditions. On the other hand, if the amount of component (b) used is greater than 55% by weight, the resulting composition will have poor alkali developability and poor adhesion to metallic surfaces. Moreover, in view of the various performance requirements for use as a solder resist, it is preferable to use component (b) in an amount of 15 to 50% by weight.

Further, in order to meet the various performance requirements for use as a solder resist, 50% by weight or more of component (b) should preferably comprise an acrylic and/or methacrylic cross-linking monomer and/or oligomer containing ester linkages not associated with acrylate and/or methacrylate and having a number average molecular weight of 200 to 800 and a number average molecular weight per polymerizable double bond of 100 to 250.

By having a moderate molecular weight and a moderate molecular weight per double bond, component (b) can impart an adequate cross-linking density to the cured coating film and thereby improve the solvent resistance and adhesion of the cured coating film at the same time. Moreover, by containing ester linkages not associated with acrylate and/or methacrylate in the molecule, component (b) can especially improve the adhesion and thermal resistance of the cured coating film and, in addition, enables the resulting composition to retain high electrical insulating properties under high-humidity conditions. Typical examples of the compound [compound (b)] meeting these requirements include neopentyl glycol hydroxypivalate diacrylate [molecular weight=312; molecular weight per polymerizable double bond=156], neopentyl glycol hydroxypivalate dimethacrylate [molecular weight=340; molecular weight per polymerizable double bond=170], a co-condensation product of succinic acid/trimethylolethane/acrylic acid (molar ratio=1/2/4) [average molecular weight=600; molecular weight per polymerizable double bond=150], a co-condensation product of adipic acid/trimethylolpropane/acrylic acid (molar ratio=1/2/4) [average molecular weight=680; molecular weight per polymerizable double bond=170], and various oligoester (meth)acrylates manufactured by Toagosei Chemical Industry Co., Ltd., such as Aronix M-6100 [average molecular weight=450; molecular weight per polymerizable double bond=225], Aronix M-6250 [average molecular weight=450; molecular weight per polymerizable double bond=225], Aronix M-6500 [average molecular weight=446; molecular weight per polymerizable double bond=223], Aronix M-7100 [average molecular weight=565; molecular weight per polymerizable double bond=188], Aronix M-8030 [average molecular weight=393, molecular weight per polymerizable double bond=119], Aronix M-8060 [average molecular weight=489; molecular weight per polymerizable double bond=136], Aronix M8100 [average molecular weight=618; molecular weight per polymerizable double bond=155], and Aronix M-6300 [average molecular weight=478; molecular weight per polymerizable double bond=239].

As described above, 50% by weight or more of component (b) should preferably comprise the above-defined compound, while the remainder may comprise another cross-linking monomer. In view of the performance requirements of a liquid photosensitive resin composition for use as a solder resist, it is preferable to use the above-defined compound in such an amount as to constitute 60% by weight or more of component (b).

The liquid photosensitive resin composition of the present invention also contains 5 to 55% by weight of an acrylic and/or methacrylic monoethylenically vinyl monomer [component (c)] as an essential component. This monoethylenically vinyl monomer not only dilutes the aforesaid epoxy acrylate and/or epoxy methacrylate [component (a)] to reduce the viscosity of the composition, but also takes part in its cure by active radiation to impart flexibility to the cured coating film and thereby improve the adhesion of the coating film to the substrate.

As the acrylic and/or methacrylic monoethyllenically vinyl monomer [component (c)], there may be used any of well-known compounds having various chemical structures. Typical examples thereof include acrylates and methacrylates such as tetrahydrofurfuryl (meth)acrylate, ethoxyethoxyethyl (meth)acrylate, 2-methoxyethyl (meth)acrylate, benzyl (meth)acrylate, cyclohexyl (meth)acrylate, dicyclopentenyloxyethyl (meth)acrylate, methyltriethylene glycol (meth)acrylate, lauryl (meth)acrylate, methyl (meth)acrylate, ethyl (meth)acrylate, n-butyl (meth)acrylate, iso-butyl (meth)acrylate, t-butyl (meth)acrylate, 2-ethylhexyl (meth)acrylate, tridecyl (meth)acrylate and stearyl (meth)acrylate.

In view of both the solvent resistance and adhesion of the cured coating film, it is essential to use component (c) in an amount of 5 to 55% by weight. If the amount of component (c) used is less than 5% by weight, the adhesion of the cured coating film will be reduced, while if it is greater than 55% by weight, its solvent resistance will be decreased. From the viewpoint of solvent resistance and adhesion, it is preferable to use component (c) in an amount of 10 to 50% by weight.

In the practice of the present invention, 50% by weight or more of component (c) should preferably comprise a compound of the formula:

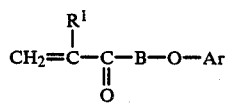

where $R^1$ is H— or $CH_3$—, B is

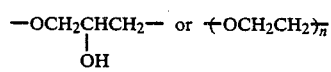

in which n is a whole number of 1 to 4, and Ar is

in which $R^2$ is H— or an alkyl group having not more than 12 carbon atoms. Specifically, the compounds within the scope of general formula [I] are characterized by the fact that the presence of a phenoxy group raises their boiling points (resulting in little odor development and little irritation to the skin) and their appropriate degree of polarity improves the adhesion of the cured coating film to metallic surfaces (at ordinary and elevated temperatures) without reducing its electrical insulating properties under high-humidity conditions. Moreover, these compounds have relatively short side chains in spite of their high molecular weights and, therefore, do not decrease the solvent resistance of hardness of the cured coating film.

Typical examples of the compounds represented by general formula [I] include phenoxyethyl acrylate, phenoxyethyl methacrylate, phenoxyethyloxyethyl acrylate, phenoxyethyloxyethyl methacrylate, phenoxytetraethylene glycol acrylate, phenoxytetraethylene glycol methacrylate, p-nonylphenoxyethyl acrylate, p-nonylphenoxyethyl methacrylate, 3-phenoxy-2-hydroxypropyl acrylate and 3-phenoxy-2-hyloxypropyl methacrylate. These compounds may be used alone or in admixture of two or more.

In view of the performance requirements of a liquid photosensitive resin composition for use as a solder resist, it is preferable to use a compound of general formula [I] in such an amount as to constitute 70% by weight or more of component (c).

Especially when 50% by weight or more of component (b) comprises an acrylic and/or methacrylic cross-linked monomer and/or oligomer containing ester linkages not associated with acrylate and/or methacrylate in the molecule and having a number average molecular weight of 200 to 800 and a number average molecular weight per polymerizable double bond of 100 to 250, and 50% or more of component (c) comprises a compound of the general formula [I], the cured coating film will have markedly improved thermal resistance and can exhibit excellent performance even under severe conditions.

In the liquid photosensitive resin composition of the present invention, the compounds containing polymerizable double bonds [components (a), (b) and (c)] comprise acrylates and/or methacrylates. However, it is preferable from the viewpoint of polymerization rate in the presence of oxygen that 50 mole % or more of the compounds containing polymerizable double bonds comprise acrylate compounds.

The liquid photosensitive resin composition of the present invention also contains 4 to 35% by weight of an inorganic filler [component (d)] as an essential component.

Unlike the other resin components, this inorganic filler is not dissolved in the liquid photosensitive resin composition, but is uniformly dispersed therein. During development with an alkaline developing solution, the inorganic filler present in the uncured regions will be washed off with the resin components, so that it exerts no adverse influence on the resolution. This inorganic filler serves not only to improve the strength of the cured coating film, but also to moderate its polymerization shrinkage and thereby improve its adhesion to the substrate.

In the practice of the present invention, there may be used any of various inorganic fillers. Typical examples thereof include calcium carbonate, talc, crystal silica, alumina and mica. Among others, plate-like particles of talc or mica and needle-like particles of talc are highly effective in improving the adhesion of the coating film. These inorganic fillers may be used without any treatment or in a form surface-treated or surface-coated with an inorganic material and/or an organic material.

In view of the strength, adhesion and resolution of the coating film, the inorganic filler should be used in an amount of 4 to 35% by weight, the preferred range being from 5 to 35% by weight.

The liquid photosensitive resin composition of the present invention also contains 0.05 to 20% by weight of a photo-initiator and/or photosensitizer [component (e)] as an essential component. The photoinitiator and/or photosensitizer can be any compound that produces a radical on exposure to active radiation such as ultraviolet or visible radiation and thereby initiates the polymerization reaction. Typical examples of usable photointiators and/or photosensitizers include 2-ethylanthraquinone, 1,4-naphthoquinone, benzoin ethyl ether, benzoin propyl ether, benzophenone, 4,4'-bis(dialkylamino)benzophenones, benzyl dimethyl ketal, 4'-isopropyl-2-hydroxy-2-methylpropiophenone, 2-hydroxy-2-methylpropiophenone and 2-methyl(4-methylthio)-phenyl-2-morpholino-1-propane. These photo-initiators and/or photosensitizers may be used alone or in an admixture of two or more. The photoinitiator and/or photosensitizer should be added in an amount of 0.05 to 20% by weight based on the total weight of the composition. However, from the viewpoint of the curing rate of the composition and the properties of the cured coating film, it is preferable to use the photo-initiator and/or photosensitizer in an amount of 0.1 to 10% by weight.

According to the intended purpose, the liquid photosensitive resin composition of the present invention may further contain various conventional additives such as thermal polymerization inhibitors, thickeners, colorants (i.e., pigments or dyes), antifoamers.

Thermal polymerization inhibitors may be used in order to present the photosensitive resin composition from being thermally cured prior to photocuring. Typical examples of usable thermal polymerization inhibitors include p-methoxyphenol, hydroquinone, p-benzoquinone, tert-butylcatecol, pyrogallol, naphthylamine and phenothiazine. In view of their influence on photocurability and other factors, thermal polymerization inhibitors should preferably be used in an amount not greater than 3% by weight, more preferably not greater than 1% by weight, based on the total weight of the composition.

Thickeners may be used in order to improve the viscosity, thixotropy and coating properties of the liquid photosensitive resin composition. Specific examples thereof include silica type thickeners such as Aerosil ®#200 [manufactured by Nippon Aerosil K.K.] and modified bentonite type thickeners such as Bentone ®500 [manufactured by NL Industry Ltd.]. In view of the properties of the cured coating film, thickeners should be used in an amount up to 20% by weight.

The liquid photosensitive resin composition with which the present invention is concerned may have any viscosity that renders the composition substantially flowable at ordinary temperatures. However, from the viewpoint of handling properties (in particular, coating properties) and other characteristics, the composition should have a viscosity of 1,000 to 100,000 cps, more preferably 2,000 to 80,000 cps, as measured at 25° C. with a Brookfield type viscometer (#7 spindle, 100 rpm).

The liquid photosensitive resin composition of the present invention may be used according to any of various well-known methods. It is most common to form a cured coating film according to a method involving the steps of application, exposure and alkali development.

The method of application can be any of various well-known methods. For example, there may be employed the "direct application method" in which the liquid photosensitive resin composition is directly applied to a printed circuit board with an applicator (such as a Baker type applicator or a bar coater) or through a silk screen; the "indirect application method" in which the liquid photosensitive resin composition is applied to the surface of a transparent film or sheet or of an artwork, and the latter is placed on a printed circuit board in such a way that the liquid photosensitive resin composition layer comes into contact with the printed circuit board; and the "double-side application method" in which the liquid photosensitive resin composition is applied to the surface of a printed circuit board and the surface of a transparent film or sheet or of an artwork, which are laid on top of each other in such a way that the liquid photosensitive resin composition layers come into contact with each other.

The method of exposure can be any of various well-known methods. For example, this can be accomplished by irradiating the liquid photosensitive resin composition layer with active radiation (such as visible or ultraviolet radiation) through a photomask. In this case, the liquid photosensitive resin composition layer may be in direct contact with the photomask or in indirect contact with the photomask through a transparent film or sheet. Alternatively, the liquid photosensitive resin composition layer may be separated from the photomask by a thin layer of gas.

Development can be carried out according to any of various well-known developing methods for photosensitive resin compositions of the alkali developing type.

Further, in order to obtain a more completely cured coating film, the alkali development may be followed by after-treatment with active radiation and/or heat.

The liquid photosensitive resin composition of the present invention is not only useful as a solder resist, but also suitable for use in a wise variety of applications such as letterpress printing.

The present invention is further illustrated by the following examples. In the examples and comparative examples given below, the resulting compositions were evaluated according to the following procedures.

(1) Preparation of a coating film ready for curing

A copper-clad laminate [ELC4708, manufactured by Sumitomo Bakelite Co., Ltd.] was cut into 10 cm × 15 cm pieces, which were pretreated by abrasion, washing and dewatering. Using a Baker type applicator, the pretreated pieces of copper-clad laminate were each coated with a liquid photosensitive resin compositions prepared under various conditions to a thickness of 100μ. Each of the coating so formed was then covered with a polyester film 25μ thick to obtain a coating ready for curing. (The term "coating ready for curing" as used herein means a coating formed as described above and then covered with a polyester film.)

(2) Determination of optimum primary exposure conditions and evaluation of developability (2)-1 Primary exposure On a coating ready for curing were placed a negative film 120μ thick (STOUFFER Resolution Guide #1-T, manufactured by Stouffer Graphic Arts Equipment Co.) and then a Pyrex ® glass plate 3 mm thick. Then, the coating is exposed to radiation from a 100 W high pressure mercury vapor lamp [UH-100, manufactured by Ushio Inc.] located 15 cm above the coating. The exposure time was varied from 10 to 180 seconds. The magnitude of the exposure energy is measured by means of a UVR-365 tester [manufactured by Tokyo Optical Co., Ltd.].

(2)-2 Development

The 25μ thick polyester film was ripped from the coating film after undergoing the primary exposure.

Then, the coating film was subjected to spray development under the following conditions.

| Developer: | 1% aqueous solution of sodium carbonate (40° C.). |
|---|---|
| Nozzle: | JUP-03 [manufactured by H. Ikeuchi & Co., Ltd.] (1.5 atm., 2.6 liters/min.). |
| Distance from nozzle: | 15 cm. |
| Time: | 30 seconds. |

Thereafter, the coating film was washed with running water, dewatered by a stream of air, and then dried at 70° C. for 5 minutes.

(2)-3 Postcuring

After completion of the development, the coating film was photocured and heat-treated under the following conditions, and then allowed to cool to room temperature:

(a) Photocuring

| Light source: | 5 kW high pressure mercury vapor lamp [H-500 UVA, manufactured by Mitsubishi Electric Corp.]. |
|---|---|
| Distance: | 20 cm. |
| Speed of passage: | 0.9 m/min. |

(b) Heat treatment (after postcuring) 160° C., 10 min.

(2)-4 Determination of optimum primary exposure energy

By comparing the coating films obtained at varying primary exposure times, the exposure energy (in mJ/cm$^2$) required to obtain a coating film reproducing the patterns of the aforesaid Resolution Guide most exactly was determined.

(2)-5 Evaluation of developability

The developability of the composition was evaluated by observing the surface of the sample developed at the optimum primary exposure energy under a microscope (30×magnification).

| O ... | No residual uncured material was present in the unexposed areas. |
|---|---|
| X ... | Residual uncured material was present in the unexposed areas. |

(3) Evaluation of properties of a cured coating film (3)-1 Primary exposure

On a coating ready for curing were placed a polyester film 120μ thick and then a Pyrex ® glass plate of 3 mm thickness. Then, the coating was exposed to radiation from a 100 W high pressure mercury vapor lamp [UH-100, manufactured by Ushio Inc.] located 15 cm above the coating, for a period of time corresponding to the optimum primary exposure energy.

(3)-2 Development

The coating film was developed in the same manner as described in (2)-2.

(3)-3 Postcuring

The coating film was postcured in the same manner as described in (2)-3.

(3)-4 Evaluation of thermal resistance

The postcured coating film, together with the substrate, was soaked in molten solder at 260° C. for either 10 or 30 seconds. After removal, the state of the coating film was examined and evaluated.

| ⊚ ... | No change was observed after soaking for 30 seconds. |
|---|---|
| O ... | No change was observed after soaking for 10 seconds. |
| X ... | Blistering, peeling and/or cracking were noted after soaking for 10 seconds. |

(3)-5 Evaluation of adhesion

The adhesion of the postcured coating film was evaluated according to the first method for crosscut adhesion testing described in JIS-D-0202. (Crosscuts were made at intervals of 2 mm.)

| ⊚ ... | The area of the lost portions was less than 5% of the total square area. |
|---|---|
| O ... | The area of the lost portions was less than 10% of the total square area. |
| X ... | The area of the lost portions was not less than 10% of the total square area. |

(3)-6 Evaluation of solvent resistance

The postcured coating film, together with the substrate, was soaked in trichloroethane at 25° C. for 15 minutes. After removal, the state of the coating film was examined and evaluated.

| O ... | No change was observed. |
|---|---|
| X ... | Blistering, peeling and/or dissolution were noted. |

(3)-7 Measurement of volume resistivity (evaluation of electrical insulating properties)

The postcured coating film was kept for 100 hours in an environment having a temperature of 50° C. and a relative humidity of 90%. Thereafter, using a Model SM-10E Ultrahigh Insulation Resistance Tester [manufactured by Toa Electronics Ltd.], the volume resistivity of the coating film was measured after a voltage of 500 V was applied for 1 minute.

EXAMPLE 1

A liquid photosensitive resin composition (Ex. 1) was prepared by mixing the following ingredients and kneading the mixture on a three-roll mill:

| Carboxyl-modified epoxy acrylate (bisphenol A type) [TOHRAD ® 3800, manufactured by Tohto Kasei Co., Ltd. average molecular weight = 500; acid value = 25] | 280 g |
|---|---|
| Neopentyl glycol hydroxypivalate diacrylate | 280 g |
| 3-Phenoxy-2-hydroxypropyl acrylate | 140 g |
| Talc [LMS-200, manufactured by Fuji Talc K.K.] | 210 g |
| Benzyl dimethyl ketal | 30 g |
| Amorphous silica [Aerosil ® #200, manufactured by Nippon Aerosil K.K.] | 60 g |
| Phthalocyanine Green | 1 g |

The above composition was evaluated according to the procedures described previously and the results thus obtained are shown in Table 1.

EXAMPLE 2

A liquid photosensitive resin composition (Ex. 2) was prepared by mixing the following ingredients and kneading the mixture on a three-roll mill:

| | |
|---|---|
| TOHRAD ® 3800 [acid value = 25] | 100 g |
| Epoxy acrylate (bisphenol A type) [TOHRAD ® 3700, manufactured by Tohto Kasei Co., Ltd.; acid value ≈ 0] | 400 g |
| Co-condensation product of succinic acid/trimethylolethane/acrylic acid (molecular ratio = 1/2/4) [average molecular weight = 680; molecular weight per polymerizable double bond = 150] | 200 g |
| Phenoxyethyl acrylate | 170 g |
| Mica [A-11, manufactured by K.K. Yamaguchi Unmo Kogyosho] | 100 g |
| Benzyl dimethyl ketal | 30 g |
| Phthalocyanine Green | 1 g |

The results of evaluation of the above composition are shown in Table 1.

EXAMPLE 3

A liquid photosensitive resin composition (Ex. 3) was prepared by mixing the following ingredients and kneading the mixture on a three-roll mill:

| | |
|---|---|
| Carboxyl-modified phenolic novolak type epoxy methacrylate [a product obtained by the reaction of a phenolic novolak type epoxy resin with methacrylic acid and the subsequent addition of succinic anhydride; molar ratio of epoxy group/methacrylic acid/succinic anhydride = 1/1/0.3; acid value = 72; average molecular weight = 1030] | 160 g |
| Neopentyl glycol hydroxypivalate dimethacrylate | 480 g |
| Phenoxyethyloxyethyl methacrylate | 175 g |
| Talc [LMS-200] | 60 g |
| Benzoin isopropyl ether | 100 g |
| Amorphous silica [Aerosil #200] | 25 g |
| Phthalocyanine Green | 1 g |

The results of evaluation of the above composition are shown in Table 1.

EXAMPLE 4

A liquid photosensitive resin composition (Ex. 4) was prepared by mixing the following ingredients and kneading the mixture on a three-roll mill:

| | |
|---|---|
| Carboxyl-modified phenolic novolak type epoxy acrylate [a product obtained by the reaction of a phenolic novolak type epoxy resin with acrylic acid and the subsequent addition of succinic anhydride; molar ratio of epoxy group/acrylic acid/succinic anhydride = 1/1/0.5; acid value = 98; average molecular weight = 1340] | 160 g |
| Aronix M-6100 [average molecular weight = 450; molecular weight per polymerizable double bond = 225] | 200 g |
| Phenoxyethyl acrylate | 490 g |
| Talc [LMS-200] | 68 g |
| Calcium carbonate [Homocal D, manufactured by Shiraishi Kogyo K.K.] | 50 g |
| Benzyl dimethyl ketal | 7 g |
| Amorphous silica [Aerosil #200] | 25 g |
| Phthalocyanine Green | 1 g |

The results of evaluation of the above composition are shown in Table 1.

EXAMPLE 5

A liquid photosensitive resin composition (Ex. 5) was prepared by mixing the following ingredients and kneading the mixture on a three-roll mill:

| | |
|---|---|
| TOHRAD ® 3800 | 300 g |
| Neopentyl glycol hydroxypivalate diacrylate | 250 g |
| Dipentaerythritol pentaacrylate | 50 g |
| 3-Phenoxy-2-hydroxypropyl acrylate | 110 g |
| Talc [LMS-200] | 200 g |
| Benzyl dimethyl ketal | 30 g |
| Amorphous silica [Nipsil ® SS-50A, manufactured by Nippon Silica Industrial Co., Ltd.] | 60 g |
| Phthalocyanine green | 1 g |

The results of evaluation of the above composition are shown in Table 1.

EXAMPLE 6

A liquid photosensitive resin composition (Ex. 6) was prepared by mixing the following ingredients and kneading the mixture on a three-roll mill:

| | |
|---|---|
| TOHRAD ® 3800 | 250 g |
| Aronix M-6500 [average molecular weight = 446; molecular weight per polymerizable double bond = 223] | 150 g |
| Aronix M-8100 [average molecular weight = 618; molecular weight per polymerizable double bond = 155] | 100 g |
| 3-Phenoxy-2-hydroxypropyl acrylate | 110 g |
| dicyclopentenyloxyethyl acrylate | 20 g |
| Talc [LMS-200] | 290 g |
| Benzyl dimethyl ketal | 30 g |
| Amorphous silica [Aerosil ® #200] | 50 g |
| Phthalocyanine Green | 1 g |

The results of evaluation of the above composition are shown in Table 1.

EXAMPLE 7

A liquid photosensitive resin composition (Ex. 7) was prepared under the same conditions as described in Example 1, except that 140 g of phenoxytetraethylene glycol acrylate was used in place of the 3-phenoxy-2-hydroxypropyl acrylate. The results of evaluation of this composition are shown in Table 1.

EXAMPLE 8

A liquid photosensitive resin composition (Ex. 8) was prepared under the same conditions as described in Example 1, except that 140 g of p-nonylphenoxyethyl acrylate was used in place of the 3-phenoxy-2-hydroxypropyl acrylate. The results of evaluation of this composition are shown in Table 1.

EXAMPLE 9

A liquid photosensitive resin composition (Ex. 9) was prepared by mixing the following ingredients and kneading the mixture on a three-roll mill:

| | |
|---|---|
| TOHRAD ® 3800 | 280 g |
| Triethylene glycol diacrylate | 100 g |
| Dipentaerithritol hexaacrylate | 90 g |
| Neopentyl glycol diacrylate | 90 g |
| 3-Phenoxy-2-hydroxypropyl acrylate | 140 g |
| Talc [LMS-200] | 210 g |
| Benzyl dimethyl ketal | 30 g |
| Amorphous silica [Aerosil ® #200] | 60 g |
| Phthalocyanine Green | 1 g |

The results of evaluation of the above composition are shown in Table 1.

EXAMPLE 10

A liquid photosensitive resin composition (Ex. 10) was prepared by mixing the following ingredients and kneading the mixture on a three-roll mill:

| | |
|---|---|
| TOHRAD ® 3800 | 280 g |
| Neopentyl glycol hydroxypivalate diacrylate | 280 g |
| Benzyl acrylate | 140 g |
| Talc [LMS-200] | 210 g |
| Benzyl dimethyl ketal | 30 g |
| Amorphous silica [Aerosil ® #200] | 60 g |
| Phthalocyanine Green | 1 g |

The results of evaluation of the above composition are shown in Table 1.

EXAMPLE 11

A liquid photosensitive resin composition (Ex. 11) was prepared by mixing the following ingredients and kneading the mixture on a three-roll mill:

| | |
|---|---|
| Carboxyl-modified phenolic novolak type epoxy acrylate [a product obtained by the reaction of a phenolic novolak type epoxy resin with acrylic acid and the subsequent addition of succinic anhydride; molar ratio of epoxy group/acrylic acid/succinic anhydride = 1/1/0.5; acid value = 98; average molecular weight = 1340] | 160 g |
| Neopentyl glycol diacrylate | 100 g |
| Triethylene glycol diacrylate | 100 g |
| Phenoxyethyl acrylate | 485 g |
| Talc [LMS-200] | 100 g |
| Benzyl dimethyl ketal | 30 g |
| Amorphous silica [Aerosil ® #200] | 25 g |
| Phthalocyanine Green | 1 g |

The results of evaluation of the above composition are shown in Table 1.

EXAMPLE 12

A liquid photosensitive resin composition (Ex. 12) was prepared by mixing the following ingredients and kneading the mixture on a three-roll mill:

| | |
|---|---|
| Carboxyl-modified phenolic novolak type epoxy acrylate [a product obtained by the reaction of a phenolic novolak type epoxy resin with acrylic acid and the subsequent addition of succinic anhydride; molar ratio of epoxy group/acrylic acid/succinic anhydride = 1/1/0.5; acid value = 98; average molecular weight = 1340] | 160 g |
| Aronix M-6100 [average molecular weight = 450; molecular weight per polymerizable double bond = 225] | 200 g |
| Cyclohexyl acrylate | 240 g |
| Methyltriethylene glycol acrylate | 245 g |
| Talc [LMS-200] | 100 g |
| Benzyl dimethyl ketal | 30 g |
| Amorphous silica [Aerosil ® #200] | 25 g |
| Phthalocyanine Green | 1 g |

The results of evaluation of the above composition are shown in Table 1.

COMPARATIVE EXAMPLES 1 TO 6

Liquid photosensitive resin compositions (Ref. 1-6) were prepared by mixing the following ingredients according to each of the formulations given below and kneading the mixture on a three-roll mill:

| | |
|---|---|
| TOHRAD ® 3800 | a g |
| Neopentyl glycol hydroxypivalate diacrylate | b g |
| 3-Phenoxy-2-hydroxypropyl acrylate | c g |
| Talc [LMS-200] | d g |
| Benzyl dimethyl ketal | 30 g |
| Amorphous silica [Aerosil ® #200] | 60 g |
| Phthalocyanine Green | 1 g |

The results of evaluation of the above compositions are shown in Table 1.

| Composition No. | a | b | c | d |
|---|---|---|---|---|
| Ref 1 | 50 | 300 | 300 | 259 |
| Ref 2 | 600 | 128 | 80 | 101 |
| Ref 3 | 280 | 80 | 249 | 300 |
| Ref 4 | 120 | 600 | 89 | 100 |
| Ref 5 | 300 | 300 | 30 | 270 |
| Ref 6 | 120 | 109 | 600 | 80 |

COMPARATIVE EXAMPLE 7

A liquid photosensitive resin composition (Ref 7) was prepared by dissolving 70 g of a linear copolymer of methyl methacrylate/methyl acrylate/methacrylic acid (weight ratio=55/20/25) [acid value=153; number average molecular weight=52,000] completely in 358 g of hydroxyethyl acrylate, adding thereto 285 g of an oligoester acrylate obtained by the co-condensation of succinic acid/trimethylolethane/acrylic acid (molar ratio=1/2/4), 28 g of benzyl dimethyl ketal, 1 g of p-methoxyphenol, 1 g of Phthalocyanine Green, 213 g of talc [LMC 100, manufactured by Fuji Talc K.K.] and 44 g of amorphous silica [Aerosil ®#200], and kneading the mixture on a three-roll mill. The results of evaluation of this composition are shown in Table 1.

COMPARATIVE EXAMPLE 8

A liquid photosensitive resin composition (Ref 8) was prepared by dissolving 70 g of the same linear copolymer as used in Example 7 completely in 358 g of tetrahydrofurfuryl acrylate, adding thereto 285 g of trimethylol propane triacrylate, 28 g of benzyl dimethyl ketal, 1 g of p-methoxyphenol, 1 g of Phthalocyanine Green, 213 g of talc [LMS 100] and 44 g of amorphous silica [Aerosil #200], and kneading the mixture on a three-roll mill. The results of evaluation of this composition are shown in Table 1.

TABLE 1

| | Composition No. | Viscosity (cps) | Optimum primary exposure energy (mJ/cm²) | Developability | Thermal resistance | Adhesion | Solvent resistance | Volume resistivity (Ωcm) |
|---|---|---|---|---|---|---|---|---|
| Example 1 | Ex 1 | 13,500 | 140 | ○ | ◎ | ◎ | ○ | $4.0 \times 10^{13}$ |
| Example 2 | Ex 2 | 7,100 | 140 | ○ | ◎ | ◎ | ○ | $5.3 \times 10^{13}$ |
| Example 3 | Ex 3 | 17,000 | 300 | ○ | ◎ | ◎ | ○ | $3.1 \times 10^{13}$ |
| Example 4 | Ex 4 | 15,100 | 200 | ○ | ◎ | ◎ | ○ | $1.1 \times 10^{13}$ |
| Example 5 | Ex 5 | 20,000 | 140 | ○ | ◎ | ◎ | ○ | $3.4 \times 10^{13}$ |
| Example 6 | Ex 6 | 17,000 | 150 | ○ | ◎ | ◎ | ○ | $3.2 \times 10^{13}$ |
| Example 7 | Ex 7 | 16,000 | 140 | ○ | ◎ | ◎ | ○ | $4.2 \times 10^{13}$ |
| Example 8 | Ex 8 | 12,300 | 150 | ○ | ◎ | ◎ | ○ | $3.5 \times 10^{13}$ |
| Example 9 | Ex 9 | 10,800 | 140 | ○ | ○ | ○ | ○ | $4.2 \times 10^{13}$ |
| Example 10 | Ex 10 | 12,400 | 135 | ○ | ○ | ○ | ○ | $3.9 \times 10^{13}$ |
| Example 11 | Ex 11 | 15,000 | 140 | ○ | ○ | ○ | ○ | $0.9 \times 10^{13}$ |
| Example 12 | Ex 12 | 17,000 | 140 | ○ | ○ | ○ | ○ | $1.2 \times 10^{13}$ |
| Comparative Example 1 | Ref 1 | 10,500 | 140 | X | ○ | ○ | ○ | $4.1 \times 10^{13}$ |
| Comparative Example 2 | Ref 2 | 14,000 | 145 | ○ | ○ | ○ | ○ | $9.3 \times 10^{11}$ |
| Comparative Example 3 | Ref 3 | 11,000 | 140 | ○ | ◎ | ◎ | X | $3.5 \times 10^{13}$ |
| Comparative Example 4 | Ref 4 | 9,800 | 140 | ○ | X | X | ○ | $4.0 \times 10^{13}$ |
| Comparative Example 5 | Ref 5 | 11,100 | 140 | ○ | X | X | ○ | $3.7 \times 10^{13}$ |
| Comparative Example 6 | Ref 6 | 9,500 | 140 | ○ | ○ | ○ | X | $1.0 \times 10^{13}$ |
| Comparative Example 7 | Ref 7 | 12,000 | 150 | ○ | ◎ | ◎ | ○ | $1.5 \times 10^{8}$ |
| Comparative Example 8 | Ref 8 | 13,000 | 150 | ○ | X | X | ○ | $2.5 \times 10^{13}$ |

What is claimed is:

1. A liquid photosensitive resin composition consisting essentially of
   (a) 10 to 55% by weight of an at least partially carboxylated compound selected from the group consisting of at least partially carboxylated multifunctional epoxy acrylates and at least partially carboxylated multifunctional epoxy methacrylates wherein said at least partially carboxylated compound is obtained by the reaction of a dibasic acid or anhydride and the addition product of an acid selected from the group consisting of acrylic acid and methacrylic acid to the epoxy groups of a polyepoxy compound; wherein said partially carboxylated compound has an average acid value of 4 to 150 and a number average molecular weight of not greater than 5,000;
   (b) 10 to 55% by weight of a cross-linking monomer having at least two monoethylenically unsaturated bonds;
   (c) 5 to 55% by weight of a vinyl monomer having one monoethylenically unsaturated bond;
   (d) 4 to 35% by weight of an inorganic filler; and
   (e) 0.05 to 20% by weight of at least one photopolymerization catalyst selected from the group consisting of photo-initiators and photosensitizers wherein at least one of the cross-linking monomer (b) or at least one of the vinyl monomer (c) satisfy at least one of the following requirements (i) and (ii):
   (i) at least 50% by weight of said cross-linking monomer (b) consists of a monomer containing ester linkages not associated with (meth)acrylate in the molecule and having a number average molecular weight of 200 to 800 and a number average molecular weight per polymerizable double bond of 200 to 250;
   (ii) at least 50% by weight of said vinyl monomer (c) consists of a compound of the general formula

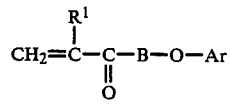

wherein $R^1$ is H— or $CH_3$—, B is —$OCH_2CHOHCH_2$— or —$OCH_2CH_2$—$_n$ in which n is a whole number of 1 to 4, and Ar is

in which $R^2$ is H— or an alkyl group having not more than 12 carbon atoms.

2. A liquid photosensitive resin composition as claimed in claim 1 consisting essentially of
   (a) 15 to 55% by weight of said at least partially carboxylated compound;
   (b) 15 to 50% by weight of said cross-linking monomer;
   (c) 10 to 50% of said vinyl monomer;
   (d) 5 to 35% of said inorganic filler; and
   (e) 0.1 to 10% by weight of said photopolymerization catalyst.

3. A liquid photosensitive resin composition as claimed in claim 2 which has a viscosity of 1,000 to 100,000 cps as measured at 25° C. with a Brookfield type viscometer (#7 spindle, 100 rpm).

4. A liquid photosensitive resin composition as claimed in claim 1 wherein said cross-linking monomer is at least one compound selected from the group consisting of
   (i) a condensation product of a dibasic acid, a dihydric or polyhydric alcohol, and acrylic acid and/or methacrylic acid, and (ii) a condensation product of a hydroxyl-containing carboxylic acid, a dihydric alcohol, and acrylic acid and/or methacrylic acid.

5. A liquid photosensitive resin composition as claimed in claim 1 wherein 50% or more of said vinyl monomer comprises a compound selected from the group consisting of phenoxyethyl acrylate, phenoxyethyl methacrylate, phenoxyethoxyethyl acrylate, phenoxyethoxyethyl methacrylate, 2-hydroxy-3-phenoxypropyl acrylate and 2-hydroxy-3-phenoxypropyl methacrylate.

6. A liquid photosensitive resin composition as claimed in claim 1 wherein said at least partially carboxylated compound has an average acid value of 5 to 100 and a number average molecular weight of not greater than 3,000.

7. A liquid photosensitive resin composition as claimed in claim 6 wherein said at least partially carboxylated compound has an average acid value of 5 to 75 and comprises predominantly bisphenol A skeletons.

8. A liquid photosensitive resin composition as claimed in claim 1 wherein 50 mole % or more of the polymerizable double bond-containing compounds included in said composition comprise acrylate compounds.

9. A liquid photosensitive resin composition as claimed in claim 1 wherein said organic filler is predominantly talc or mica wherein said talc or mica may be modified.

* * * * *

UNITED STATES PATENT AND TRADEMARK OFFICE
CERTIFICATE OF CORRECTION

PATENT NO. : 4,789,620

DATED : December 6, 1988

INVENTOR(S) : SASAKI, Isao; KUSHI, Kenji; INUKAI, Ken-ichi

It is certified that error appears in the above-identified patent and that said Letters Patent is hereby corrected as shown below:

<u>Column 17</u>
In claim 1, line 65, delete "200" and insert therefor --100--.

Signed and Sealed this

Twenty-fourth Day of July, 1990

Attest:

HARRY F. MANBECK, JR.

*Attesting Officer*   *Commissioner of Patents and Trademarks*